United States Patent [19]

Yoshino et al.

[11] 4,268,602

[45] May 19, 1981

[54] PHOTOSENSITIVE O-QUINONE DIAZIDE CONTAINING COMPOSITION

[75] Inventors: Tsuneo Yoshino, Fujisawa; Gentaro Ohbayashi, Kamakura, both of Japan

[73] Assignee: Toray Industries, Ltd., Tokyo, Japan

[21] Appl. No.: 966,563

[22] Filed: Dec. 5, 1978

[51] Int. Cl.³ .................. G03C 1/54; G03C 1/60; G03C 1/70

[52] U.S. Cl. .................. 430/192; 430/165; 430/166; 430/313; 430/314; 430/318; 430/327; 430/329; 430/330; 430/331; 204/159.23

[58] Field of Search .................. 96/91 D, 75, 33, 36; 430/192, 176, 197, 326

[56] References Cited

U.S. PATENT DOCUMENTS

| | | | |
|---|---|---|---|
| 3,126,281 | 3/1964 | Sus et al. | 96/91 D |
| 3,269,837 | 8/1966 | Sus | 96/91 D |
| 3,402,044 | 9/1968 | Steinhoff | 96/91 D |
| 3,502,470 | 3/1970 | Delzenne et al. | 96/91 D |
| 3,533,796 | 10/1970 | Lassig et al. | 96/91 D |
| 3,597,202 | 8/1971 | Cerwinka | 96/91 D |
| 3,660,097 | 5/1972 | Mainthia | 96/91 D |
| 3,725,356 | 4/1973 | Ludeus et al. | 96/91 D |
| 3,759,711 | 9/1973 | Rauner et al. | 96/91 D |
| 3,933,885 | 1/1976 | Satomura | 96/91 D |
| 4,093,461 | 6/1978 | Loprest et al. | 96/91 D |
| 4,104,070 | 8/1978 | Moritz et al. | 96/91 D |

OTHER PUBLICATIONS

Dinaburg, M. S., "Photosensitive Diazo Cpds", The Focal Press, 1964, pp. 191-196.

*Primary Examiner*—Charles L. Bowers, Jr.
*Attorney, Agent, or Firm*—Wegner & Bretschneider

[57] ABSTRACT

The present invention relates to a novel photosensitive composition. In particular, the present invention relates to a photosensitive resin composition suitable for use as a photoresist.

3 Claims, No Drawings

PHOTOSENSITIVE O-QUINONE DIAZIDE CONTAINING COMPOSITION

The present invention relates to a novel photosensitive composition. In particular, the present invention relates to a photosensitive resin composition suitable for use as a photoresist.

Heretofore, as a photosensitive resin composition whose solubility varies by exposure, various types of resin composition such as polymerization-type (Example: Du Pont's "Riston"), cross linking-type (Example: Kodak's "KTFR" and "KPR") and decomposition-type (Example: Shipley's "AZ1350") compositions have been proposed. Polymerization-type and cross-linking-type resins are usually sensitive to oxygen and therefore various devices to avoid the effect of oxygen, which make operations complicated, are required, and/or the results are not excellent. A cross linked resin constituting a resist pattern is not removable by dissolution and sometimes causes contamination and scratches on the surface of the product. Decomposition-type resins based on orthoquinone diazide and a binder, suffer from a low chemical resistance and long exposure required for a thick layer. Because of high concentration of sensitizer, a cross linking-type resin composition is inadequate to be used as a thick layer like a dry film resist. The present invention is directed to the provision of a photosensitive resin composition, suitable for use as a photoresist whose solubility in an organic solvent varies by exposure, an exposed portion thereof remaining after developement which may be dissolved and removed by a separate and more polar solvent, and having, at the same time, excellent mechanical properties, chemical resistance, insensitivity to oxygen, a wide latitude of exposure and wide selectivity of light sources.

The photosensitive resin composition according to the present invention comprises an organic polymer having a secondary or tertiary amino group and orthoquinone diazide. It is not necessary that the composition is prepared by a complicated means such as introducing an orthoquinone diazide group into the chain of a high molecular weight substance, but also it is possible that it be made with a much lower amount of orthoquinone diazide relative to a conventional photosensitive material using orthoquinone diazide. Accordingly, the photosensitive resin composition according to the present invention is characterized in that it is not only economical in terms of material, but also a small amount of light energy is enough even when the photosensitive layer is thick and permissible variation of the film thickness is large.

Because the amount of secondary and tertiary amino groups in a polymer of the present invention may be slight, selectivity of elements composing most part of the polymer is large. By this fact, is it possible to approach values of the dynamic properties, adhesion, chemical resistance and other physical properties of this polymer to objective values by properly selecting such constitutional elements.

As an amino group used for the polymer of a photosensitive resin composition in the present invention, a variety of groups ranging from strong basic group such as trialkylamino to weak basic group such as pyridyl may be used.

One kind of such amino group is shown by a general formula

wherein
R is
(1) alkyl of 1 to 12 carbon atoms,
(2) phenyl of 6 to 11 carbon atoms,
(3) aralkyl of 7 to 14 carbon atoms,
(4) cycloalkyl of 3 to 6 carbon atoms, or
(5) alkyl of 6 to 12 carbon atoms having a cycloalkyl group of 3 to 6 atoms, and
R' is hydrogen or any of the groups mentioned above for R. R and R' may be unsubstitued or further substituted by other substituents.

Other kind of such amino group is shown by a general formula

wherein R' is as defined above.

Other kinds of such amino groups include cyclic amino such as aromatic or non-aromtic heterocycle (mono- or bi-cycle), composed of 3 to 10 atoms including one or more hetero atoms such as nitrogen, oxygen and sulfur, in which at least one nitrogen atom is contained.

Various polymers containing such amino groups which are suitable for use in the preparation of photosensitive compositions of the present invention can be easily obtained. For example, the polymers are obtained by homo-polymerization of vinylically unsaturated monomers containing such amino groups as substituents, or copolymerization of these with one or more ethylenically unsaturated monomers.

Examples of such monomers containing said amino groups are as follows:

A. Alkyl acrylate derivatives:

dimethylaminoethyl acrylate, diethylaminoethyl acrylate, dipropylaminohexyl acrylate, dibutylaminoethyl acrylate, dipentylaminoethyl acrylate, dihexylaminoethyl acrylate, diheptylaminoethyl acrylate, dioctylaminoethyl acrylate, methylethylaminooctyl acrylate, methylpropylaminoethyl acrylate, methybutylaminoethyl acrylate, methypentylaminoethyl acrylate, methylhexylaminoethyl acrylate, methylheptylaminoethyl acrylate, methyloctylaminoethyl acrylate, ethylpropylaminoethyl acrylate, ethylbutylaminoethyl acrylate ethylheptylaminoethyl acrylate, ethyloctylaminoethyl acrylate, propylbutylaminoethyl acrylate, propylpentylaminoethyl acrylate, propylhexylaminoethyl acrylate, propylheptylaminoethyl acrylate, propyloctylaminoethyl acrylate, butylheptylaminoethyl acrylate, butylhexylaminopropyl acrylate, butyloctylaminoethyl acrylate, penthlhexylaminoethyl acrylate, pentylheptylaminoethyl acrylate, pentyloctylaminopropyl acrylate, hexylheptylaminoethyl acrylate, hexyloctylaminoethyl acrylate, heptyloctylaminoethyl acrylate, benzylmethylaminoethyl acrylate, benzylethylaminoethyl acrylate, benzylpropylaminoethyl acrylate, benzylbutylaminoethyl acrylate, benzylpentylaminoethyl acrylate, benzylhexylaminoethyl acrylate, benzylheptylaminoethyl acrylate, benzyloctylaminoethyl acrylate, cyclohexylmethylaminoethyl acrylate, cyclohexylethylaminopropyl acrylate, cyclohexylpropylaminoethyl acrylate, cyclohexylbutylaminoethyl acrylate, cyclohexylpentylaminohexyl acrylate, cyclohexylhexylamimooctyl acrylate, cyclohexylheptylaminoethyl acrylate, cyclohexyloctylaminopropyl acrylate, aziridinoethyl acrylate, azetinopropyl acrylate, pyrrolidinohexyl acrylate, piperidinoethyl acrylate, piperazinoethyl acrylate and morpholinoethyl acrylate.

B. Other alkyl ester derivatives of acrylic acid:

Derivatives obtainable by substituting some of the hydrogen atoms of said monomer belonging to A with a hydroxyl amino, ether, or halogen group, for example, methylhydroxylmethylaminoethyl acrylate and chloromethylmethylaminoethyl acrylate.

C. Alkyl ester derivatives of methacrylic acid:

Derivatives obtainable by substituting the acrylic acid portion of monomers belonging to above groups A and B with methacrylic acid such as for example, dimethylaminoethyl methacrylate, diethylaminoethyl methacrylate, benzylethylaminopropyl methacrylate, cyclohexylaminobutyl methacrylate, piperidinoethyl methyacrylate and 3-N,N-diethyl-amino-2-hydroxypropyl methacrylate.

D. Vinyl amines and allylamines:

N-vinyl amines such as N-vinyldiethylamine, N-vinyldiphenylamine, N-vinyl-N-methylaniline, N-vinyl-α-methylindoline, N-vinyl-morpholine, (N-vinyl-N-phenyl-napthylamine), N-vinylimidazole, N-vinylcarbazole and N-vinyl-N,N-dicyclohexylamine; allylamines such as N,N-dimethylallylamine, N,N-diethylallylamine and methyl allyl 3-methoxypropylamine.

E. Vinyl pyridines and vinyl Quinolines:

In the preparation of a polymer carrying amino group, two or more monomers are usually copolymerized with a monomer or monomers carrying an amino group, so that the polymer satisfies many qualities required for each use of photosensitive resins and is obtainable by using popular cheap monomers, at least as the major components of the monomer mixture.

As copolymerizable monomers may be mentioned alkyl esters of acrylic acid, the alkyl group of which has 1-12 carbon atoms such as methyl acrylate, ethyl acrylate, propyl acrylate, butyl acrylate, pentyl acrylate, hexyl acrylate, heptyl acrylate, octyl acrylate, 2-ethyl hexyl acrylate, nonyl acrylate, decyl acrylate, undecyl acrylate, and dodecyl acrylate; alkyl esters of methyacrylic acid, the alkyl group of which has 1-12 carbon atoms such as methyl methacrylate, ethyl methacrylate, propyl methacrylate, butyl methylacrylate, penthyl methacrylate, hexyl methacrylate, heptyl methacrylate, octyl methacrylate, 2-ethyl hexyl methacrylate, nonyl methacrylate, decyl methacrylate, undecyl methacrylate and dodecyl methacrylate; styrene and derivatives such as α-methyl styrene as well as acrylonitrile, methylacrylonitrile, vinyl acetate, butadiene, vinyl chloride, acrylic acid and mathacrylic acid. The above monomers are merely exemplary. The copolymerization reaction may be carried out by a radical process using a polymerization initiator, a process using ultraviolet or radical rays, or an ionic polymerization process using butyl lithium or sodium/naphthalene complex as a polymerization initiator. Because a radical polymerization can be practiced means of bulk polymerization, solution polymerization, suspension polymerization or emulsion polymerization, are convenient for the present purpose.

As explained hereinabove, a polymer according to the present invention is generally obtained by polymerizing a monomer carrying an amino group. It may of course, be prepared by introducing amino groups into the polymer later on or forming amino groups during polymerization. An amino group is allowed to be in the side chain and/or in the main chain.

The amount of the amino group calculated as the weight fraction of nitrogen in the polymer constituting a photosensitive resin according to the present invention, is normally in the range of 1/10-1/10,000, and particularly in the range 1/100-1/1,000, is preferably used.

With respect to photosensitivity, there is no upper limit as to the amount of the amino group. However, when the amount of the amino group is very large, the resistance of the resin composition to acidic plating or etching solution tends to be lowered. Therefore, when these operations are required, a rather low content of the amino group is suggested.

In selecting the copolymerization monomers and the ratio of them, it is important to consider the developing solvent at first.

Because there are only a few developing solvents for photosensitive resins that satisfy both the harmlessness and the economy at the same time. And, if the flame retardance is required, the developing solvents are limited to 1,1,1-trichloroethane and water. On the other hand, in the case of a photosensitive resin composition according to the present invention, the degree of freedom of selecting the kind of polymer is large, and it is possible to select a polymer so as to be fit to a developing solvent. Namely, in conformity with a developing solvent, with the small freedom of selection, the kind and the quantitative ratio of copolymerization monomers can be selected.

In a photosensitive resin composition of the present invention, the polymer component may be a mixture of different polymers.

As an orthoquinone diazide used for a photosensitive resin composition of the present invention, compounds of various structures may be used. Compounds having orthoquinone diazide groups of the benzene, naphthalene, dinaphthyl and quinoline series are used. By introducing one or more groups other than orthoquinone diazide group, solubility, compatibility with polymer and other properties of the compound can be changed to meet the objects. For example, when 1,1,1-trichloroethane is used as a developing solvent, an orthoquinone diazide compound having one or more groups selected from amide group, sulfonamide group, hydroxyl group and carboxyl group is preferably used.

Examples of such compounds are amides and esters formed between sulphonic acid derivatives of naphthoquinone diazide and benzoquinone diazide, and ammonia, amines such as methyl amine, ethanol amine, aniline, 2-hydroxy aniline, 3-hydroxy aniline, 4-hydroxy aniline, 2,6-dihydroxy aniline, 2,5-dihydroxy aniline, o-amino-p-cresol, p-amino-benzoic acid, 7-hydroxynaphthylamine-(2), 3-amino-4hydroxy-diphenyl, etc., and alcohols such as ethylene glycol, glycerol, phenol, catechol, hydroquinone, p-hydroxy benzoic acid, p-hydroxy benzamide, p-hydroxyl benzene sulfonamide, 2,2'-dihydroxy-diphenyl, 2,7-dihydroxy naphthalene etc. However, a compound unlikely to dissolve in a film-making solvent or not uniformly miscible with a polymer owing to containing too many aforesaid groups or a group of metal salt of sulfonic acid, is undesirable.

The amount of orthoquinone diazides used in the present invention is about 1/5–1/500, based on the weight of the polymer, and usually 1/10–1/100. This small amount is significantly different from that in a conventional photosensitive film in which orthoquinone diazide occupies nearly one half the entire photosensitive resin.

An orthoquinone diazide compound with two or more orthoquinone diazide groups or a mixture of ortho quinone diazid compounds may also be effectively utilized in accordance with the invention. Besides orthoquinone diazide, additives such as coloring agent, plasticizer and cross-linking agent may be used.

The film of a photosensitive resin composition in the present invention may be easily prepared by spreading a solution containing both the polymer and orthoquinone diazide on a supporter such as metal plate, glass plate, plastics plate, polyethylene terephthalate film or paper, and drying the liquid film by infrared rays, or by heating from the back surface of the supporters. The photosensitive film can be also prepared by the following method. The liquid film on the supporter may be immersed in a solvent which is miscible with the solvent of the polymer solution, but does not dissolve the polymer and orthoquinone diazide, to coagulate the said liquid film. Thereafter, the coagulated film may be dried into a solid film. Furthermore, it is also possible to prepare a photosensitive film by immersing the polymer film (without orthoquinone diazide) in an orthoquinone diazide solution which does not substantially dissolve but can swell the polymer film and then drying the film.

If necessary, the photosensitive film thus prepared may be laminated on another photosensitive film or on the surface of another supporter. Even when the laminator are required to be heated, the object is attained without destroying the photosensitivety. It is permissible to expose the film immediately after the lamination without requiring a so-called waiting time.

The exposure of the photosensitive layer of the present invention can be performed by usual methods but also by simple methods and/or with better results.

The exposure of the photosensitive resin composition of the present invention being not affected by oxygen, it may be carried out in air. Accordingly, there is no necessity for exposing the film in vacuo or in nitrogen or exposing the film within a very short period by remarkable strong rays against diffusion of oxygen. And it is possible to avoid lowering of image resolution due to exposure by covering a photosensitive layer with a transparent film for shutting up air.

In case a photosensitive film of the present invention is exposed in close contact with a pattern mask, it is possible to expose without collimation. Accordingly, it is possible to expose to light from a luminous surface prepared by arranging fluorescent lamps having a luminous peak in the vicinity of 400 manometer where orthoquinone diazide is photosensitive. The adoption of fluorescent lamps is effective for simplifying exposure apparatus and operation. Needless to say, it is also possible to carry out exposure by an ultra high-pressure mercury lamp with or without collimator.

A photosensitive resin of the present invention has, besides the merits mentioned above, the following characteristics in respect of exposure. One is the larger latitude of exposure.

Secondly, because a small amount of orthoquinone diazide is sufficient for the photosensitive composition of the present invention, long exposure is not required even when the photosensitive layer is thick. Another characteristics is that the development can be done immediately after the exposure. Namely, a waiting time or a heat-treatment between exposure and development as is often seen in a polymerization-type photosensitive material is not required.

Development may be carried out by immersion or spraying. However, spraying or immersion followed by spraying is effective in shortening the required development period. Washing with a non-solvent immediately after the development makes the finish more beautiful. This washing may be carried out with water.

When a resin film pattern obtained by development and washing is used as a resist for usual plating or etching as in preparation of a printed circuit board, the resin film does not require to be cured. The chemical resistance of the resist greatly increases by curing after development, although it depends upon the kind of polymer used. When a resist pattern is dipped in a hydrogen fluoride etching solution or in a molten soldering bath, the resist is usually required to be cured.

A resist remaining on the board after plating and etching may be dissolved by an ordinary solvent (for example, acetone) different from the developing solvent. Namely, special reagents or operations are not required. However, a resist cured at a high temperature for a long time is difficult to be dissolved and like the case of polymerization-type photosensitive resist, such resist may be removed by being swollen by methylene chloride and thereafter brushed.

A polymer having a basic group used for a photosensitive resin composition according to the present invention can be coagulated by adding a strong mineral acid to a solution of the said polymer in a developing solvent of small polarity. Therefore, it is possible to separate the solvent from the polymer without distillation.

EXAMPLE 1

A mixture of methyl methacrylate, ethyl acrylate, acrylonitrile, 2-N,N-dimethylaminoethyl methacrylate, methyl cellosolve, and azobisisobutyronitrile 16/14/8/2/40/0.075 in weight ratio, was maintained at 85° C. for 120 minutes with stirring under an argon atmosphere to prepare a syrup having a polymer concentration of 27.5%. Under a yellow fluorescent lamp, naphthoquinone-(1,2)-diazide-(2)-5-sulfo(4'-hydroxy)anilide, 7/100 of the polymer in weight, was dissolved into the syrup.

The solution was spread on a copper-clad glass-epoxy board by use of spinner, and dried to form a film of 10 microns thickness. Through a contact negative transparency of a pattern with line widths and line intervals of 150 microns, the surface of the photosensitive film was exposed for 15 seconds to the light from a luminous surface composed of fluorescent lamps (Matsushita, FLR 40EHBA-40N/C) with central wave length emission at 40 nm. The color of the exposed portion turned violet from yellow. After removing the mask, the imaged layer was spray developed by 1,1,1-trichloroethane at 20° C. and washed with water spray. Then the copper clad board was etched by spraying a 30% solution of iron chloride at 40° C., and the remaining resist was dissolved off by spraying 1,1,1-trichloroethane/alcohol (5/1) mixture. Thus a glass-epoxy board having a copper pattern in the light exposed portion was obtained.

EXAMPLE 2

A mixture of methyl methacrylate, ethyl acrylate, 2-N,N-dimethylaminoethyl methacrylate, methyl cellusolve and 4,4'-azobis-(4-cyano valeric acid), 5/4/1/10/0.013 in weight ratio, was maintained at 80° C. for 90 minutes with stirring under an argon atmosphere to prepare a syrup with polymer concentration of 22%. 16 parts by weight of Naphthoquinone-(1,2)-diazide-(2)-5-sulfo(4'-hydroxy)-anilide, was dissolved into 100 parts by weight of this syrup, which was then diluted with 400 parts of diethylene-glycol dimethylether under a yellow fluorescent lamp to prepare a photosensitive liquid.

A quartz plate was immersed in diphenyldichlorosilane, washed with acetone and dried. Onto this quartz plate, said photosensitive liquid was spread using a spinner and dried to form a solid film about 0.5 microns thick. This solid film was exposed for 10 seconds through a chromium mask to an ultra-high pressure mercury light source (Ushio-Uniark-250), spray-developed with 1,1,1-trichloroethane at 20° C., washed with cyclohexane, and dried to obtain a resist image clear to a pattern of 1 micron width.

After curing at 210° C. for 30 minutes, said quartz plate was immersed in a buffering hydrogen fluoride solution for 10 minutes, washed with water and dried, and thereafter lightly rubbed with a fabric in acetone to remove the resist to obtain a convex image having a height of about 1 micron and having the same pattern as the aforesaid resist pattern.

EXAMPLE 3

To a mixture of methyl methacrylate, ethyl acrylate, 2-N,N-dimethylaminoethyl methacrylate and benzene, 10/9/1/20 in volume ratio, was added azobisisobutyro nitorile to given a concentration of 4 g/liter. The resultant mixture was maintained at 70° C. for 75 minutes under an argon atmosphere and a polymer precipitated by addition of cyclohexane to the mixture was dried in vacuo. This polymer was dissolved in dimethyl formamide to give 30% solution of the polymer. Naphthoquinone-(1,2)-diazide-(2)-5-sulfonamide, 3/100 of the polymer in weight, was added to and dissolved in said solution under a yellow fluorescent lamp.

The obtained solution was spread on a 25-microns thick polyethylene terephthalate film and dried with an infrared heater to form a 20-microns thick solid film.

Onto a 2-mm thick brass plate preheated to about 100° C., the said solid film was laminated at 110° C. After peeling off the polyethylene terephthalate film, the photosensitive layer was exposed for 15 seconds in the same way as Example 1.

After removing the film mask, non-exposed portions were removed by spraying 1,1,1-trichloroethane at 20° C. and the brass plate was washed with water spray. The said brass plate with a resist pattern was etched by spraying an iron chloride solution at 40° C., washed with water and dried. The brass plate was then immersed in acetone to dissolve off the resist, and an uneven brass image with depth of 150 microns was obtained.

EXAMPLE 4

To a mixture of methyl methacrylate, ethyl acrylate, 2-vinyl pyridine and benzene, 9/10/1/20 in volume ratio, was added azobisisobutyronitrile to give a concentration of 2 g/liter. The resultant solution was maintained at 70° C. for 1 hour under argon atomosphere and the polymer precipitated with cyclohexane was dried in vacuo. One part of this polymer and 0.05 part of Naphthoquinone-(1,2)-diazide-(2)-sulfo(4'-hydroxy)anilide was dissolve in methyl cellosolve under a yellow fluorescent lamp.

The obtained solution was spread on a 25-microns thick polyethylene terephtalate film and dried with an infrared heater to form a 20 microns thick solid layer. On each of clean surfaces of a copper-clad glass-epoxy board, the photosensitive layer on polyethylene terephthalate film was laminated by passing through pressure rollers heated to 120° C. After the polyethylene terephthalate film was removed from the photosensitive layer on each side of the board, the photosensitive layers were imagewise exposed for 20 seconds in the same way as Example 1. After removing the film masks, the imagewise exposed layers were developed with spray of 1,1,1-trichloroethane at 20° C. and washed with water spray.

The copper clad board with resist patterns was etched with spray of 30% solution of iron chloride at 40° C., washed with water, dried and thereafter immersed in a 1,1,1-trichloroethane-ethanol mixture to remove the resist by dissolution. Then a glass-epoxy board having positive copper patterns was obtained.

EXAMPLE 5

Polymerization was carried out for a mixture of methyl methacrylate, ethyl acrylate, 2-N,N-dimethylaminoethyl methacrylate, methyl cellosolve, and 4,4'-azobis-(4-cyano valeric acid), 5/4/1/10/0.013 in weight, under an argon atmosphere at 80° C. with stirring for 90 minutes to prepare a syrup having a polymer concentration of 22%. Naphthoquinone-(1,2)-diazide-(2)-5-sulfo(4'-hydroxy)anilide, 5/100 of the polymer in weights, was dissolved into this syrup under a yellow fluorescent lamp. The solution was spread on a 25-micron thick polyethylene terephthalate film and dried with infrared rays to prepare a 20-microns thick solid film.

The photosensitive film was laminated on each side of a copperclad glass-epoxy board by passing through pressure rollers heated to 115° C. After the polyethylene terephthalate covers were peeled off, the photosensitive layers were exposed for 20 seconds to light from luminous surfaces mentioned in Example 1 through a contact negative transparencies of pattern with line intervals and line widths of 100 microns.

The exposed layers were developed with spray of 1,1,1-trichloroethane at 20° C., and washed with water spray.

The uncovered portion of copper foils of the glass-epoxy board were, according to the usual way, lightly etched with spray of an ammonium persulfate solution, washed with water, washed with a 20% sulfuric acid and washed with water, thereafter, the board was electroplated in a copper pyrophosphate bath, washed with water, further, electroplated in an acidic gold bath, washed with water and dried. After the resist was removed by dissolution in a 1,1,1-trichloroethane-ethanol mixture, the copper clad board was washed with water and then etched by spraying 30% solution of iron chloride at 40° C. to obtain gold plated copper patterns corresponding to non-exposed portions.

EXAMPLE 6

A mixture of methyl methacrylate, ethyl acrylate, acrylonitrile, 2-N,N-dimethylaminoethyl methacrylate, methyl cellosolve and 4,4'-azobis-(4-cyanovaleric acid), 14/17/7/2/40/0.1 in weight ratio, was maintained at 85° C. for 90 minutes with stirring under an argon atmosphere to prepare a syrup containing 21% of polymer. Under a yellow fluorescent lamp, naphthoquinone-(1,2)-diazide-(2)-5-sulfo(4'-hydroxy)anilide, 7/100 of the polymer, was dissolved into this syrup. The solution was spread on a 25-micron thick polyethylene terephthalate film supported by a glass plate, and then the entirety including the said glass plate was immersed in water for 1 minute to coagulate the liquid film, and placed in hot air stream at 100° C. for 5 minutes to form a 20-microns thick transparent solid layer.

The photosensitive layer was laminated on each cleaned surface of a two sided copper clad glass-epoxy board by passing through pressure rollers heated to 120° C. After the polyethylene terephthalate film covers were removed, the photosensitive layers were exposed for 20 seconds by the method discribed in Example 5.

The imagewise exposed layers were developed with spray of 1,1,1-trichloroethane at 20° C. to remove non-exposed portions and then washed with water spray. The uncovered portions of the copper foils of the glass-epoxy board were according to the usual way, lightly etched with spray of an ammonium persulfate solution, washed with water, washed with a 20% sulfuric acid, washed with water. Thereafter electroplated in a copper sulfate bath, washed with water, further, electroplated in acidic gold bath, washed with water and dried. After the resist was removed by dissolution in methyl cellosolve, the copper clad board was washed with water, and then etched with spray of 30% solution of iron chloride at 40° C. to obtain a gold plated copper patterns corresponding to non-exposed portions.

What is claimed is:

1. A resin composition suitable for use as a photoresist, wherein solubility in an organic developing solvent varies with light exposure, an exposed portion remaining after development, consisting of an admixture comprising
   as an ingredient an organic resin obtained by homopolymerization of vinylically unsaturated monomers containing a basic amino group —NRR' which is no less basic than pyridyl or by copolymerization of said vinylically unsaturated monomers containing a basic amino group —NRR' no less basic than pyridyl with one or more ethylenically unsaturated monomers;
   wherein R is $C_{1-12}$alkyl, $C_{6-11}$phenyl, $C_{7-14}$aralyl; $C_{3-6}$cycloalkyl or $C_{6-12}$cycloalkylalkyl having a cycloalkyl group of 3 to 6 carbon atoms and R' is independently any group defined by R; or wherein NRR' is pyridyl or a nonaromatic heteromonocycle composed of 3 to 10 nuclear atoms including no more than two heteroatoms selected from N,O and S of which at least one is N;
   wherein the nitrogen content of said NRR' group in said organic polymer is 0.01% to 10% by weight on the basis of the weight of said polymer; and
   as an additional ingredient one part by weight of a photosensitive orthoquinone diazide per 5 to 500 parts of said organic polymer.

2. A photosensitive resin composition of claim 1, wherein said amino group is

wherein
   R is $C_{1-12}$alkyl, $C_{6-12}$phenyl; $C_{7-14}$aralkyl; $C_{3-6}$cycloalkyl; or $C_{6-12}$cycloalkyl-alkyl having a cycloalkyl group of 3 to 6 carbon atoms; and
   R' is hydrogen or independently any group defined by R.

3. A photosensitive resin composition of claim 1, wherein said amino group is

wherein R' is $C_{1-12}$alkyl, $C_{6-11}$phenyl; $C_{7-14}$aralkyl; $C_{3-6}$cycloalkyl; or $C_{6-12}$cycloalkyl-alkyl having a cycloalkyl group of 3 to 6 carbon atoms.

* * * * *